United States Patent
Kawazoe et al.

(10) Patent No.: US 8,961,686 B2
(45) Date of Patent: Feb. 24, 2015

(54) METHOD OF MANUFACTURING MONOCRYSTAL, FLOW STRAIGHTENING CYLINDER, AND MONOCRYSTAL PULLING-UP DEVICE

(75) Inventors: Shinichi Kawazoe, Omura (JP); Fukuo Ogawa, Omura (JP); Yasuhito Narushima, Omura (JP); Toshimichi Kubota, Omura (JP)

(73) Assignee: Sumco Techxiv Corporation, Omura-shi, Nagasaki (JP)

( * ) Notice: Subject to any disclaimer, the term of this patent is extended or adjusted under 35 U.S.C. 154(b) by 1259 days.

(21) Appl. No.: 12/678,400

(22) PCT Filed: Jul. 25, 2008

(86) PCT No.: PCT/JP2008/063398
§ 371 (c)(1),
(2), (4) Date: Mar. 16, 2010

(87) PCT Pub. No.: WO2010/010628
PCT Pub. Date: Jan. 28, 2010

(65) Prior Publication Data
US 2010/0212580 A1    Aug. 26, 2010

(51) Int. Cl.
C30B 15/02    (2006.01)
C30B 15/04    (2006.01)
C30B 15/20    (2006.01)
C30B 29/06    (2006.01)

(52) U.S. Cl.
CPC .................. *C30B 15/04* (2013.01); *C30B 15/20* (2013.01); *C30B 29/06* (2013.01)
USPC .................... 117/13; 117/16; 117/20; 117/31; 117/216

(58) Field of Classification Search
USPC .................................. 117/13, 16, 20, 31, 216
See application file for complete search history.

(56) References Cited

U.S. PATENT DOCUMENTS

| | | | |
|---|---|---|---|
| 5,904,768 A | 5/1999 | Holder | |
| 6,214,109 B1 | 4/2001 | Holder | |
| 7,323,946 B2 | 1/2008 | Seefeldt et al. | |
| 8,123,855 B2* | 2/2012 | Ren et al. | ......................... 117/19 |
| 2009/0120352 A1 | 5/2009 | Kubota et al. | |

FOREIGN PATENT DOCUMENTS

| | | | |
|---|---|---|---|
| JP | 03-177389 A | 1/1991 | |
| JP | 10-182289 A | 7/1998 | |
| JP | 2002-097098 A | 4/2002 | |
| JP | 2002-321997 A | 11/2002 | |
| JP | 2007-031235 A | 2/2007 | |
| JP | 2007-112663 A | 5/2007 | |

OTHER PUBLICATIONS

International Preliminary Report on Patentability (IPRP) dated Mar. 8, 2011 (in English) in parent International Application No. PCT/JP2008/063398.
English Language International Search Report dated Aug. 19, 2008, issued in parent Appln. No. PCT/JP2008/063398.

* cited by examiner

*Primary Examiner* — Bob M Kunemund
(74) *Attorney, Agent, or Firm* — Holtz, Holtz, Goodman & Chick PC

(57) ABSTRACT

For manufacturing a monocrystal, a monocrystal pulling-up device controls pressure within a flow straightening cylinder to be from 33331 Pa to 79993 Pa and a flow velocity of inert gas in the cylinder to be from 0.06 m/sec to 0.31 m/sec (0.005 to 0.056 SL/min·cm$^2$) during a post-addition-pre-growth period. By controlling the flow velocity of the inert gas to be in the above-described range during the post-addition-pre-growth period, the inert gas flows smoothly even when the pressure within the cylinder is relatively high. Evaporation of a volatile dopant because of a reverse flow of the inert gas can be restrained. The volatile dopant can be prevented from adhering to the flow straightening cylinder in an amorphous state, and the volatile dopant can be prevented from dropping into a melt or sticking on the melt while growing a crystal. Foulings can be easily removed.

6 Claims, 4 Drawing Sheets

METHOD OF MANUFACTURING MONOCRYSTAL, FLOW STRAIGHTENING CYLINDER, AND MONOCRYSTAL PULLING-UP DEVICE

This application is a U.S. National Phase Application under 35 USC 371 of International Application PCT/JP2008/063398 filed Jul. 25, 2008.

TECHNICAL FIELD

The present invention relates to a method of manufacturing a monocrystal, a flow straightening cylinder, and a monocrystal pulling-up device.

BACKGROUND ART

A monocrystal of a base material such as silicon has been necessary for manufacturing a semiconductor material. As a method of manufacturing a monocrystal, Czochralski method (CZ method) has been typically known (for instance, see Patent Documents 1 and 2). Also, a method of controlling resistivity of a monocrystal has been known in which a volatile dopant such as arsenic, red phosphorus, or antimony is added to a known silicon melt used in the Czochralski method (for instance, see Patent Document 3).

In a device disclosed in Patent Document 1, a gas flow straightening inner cylindrical member is disposed above a silicon melt accommodated in a crucible. A heat insulating ring is integrated with a lower end of the gas flow straightening inner cylindrical member so as to project radially and outwardly. In addition, a gas flow straightening outer cylindrical member is integrated with an outer circumferential edge of the heat insulating ring so as to have an outer circumference facing to an inner circumference of the quartz crucible and extend upwardly.

For growing a monocrystal, inert gas is introduced to flow downwardly in the gas flow straightening inner cylindrical member to be blown onto a surface of a material melt. The inert gas subsequently flows along the surface of the material melt and further flows through a lower edge of the gas flow straightening inner cylindrical member and a lower surface of the heat insulating ring to turn upwardly. Then, the inert gas flows upwardly along an inner wall surface of the quartz crucible to be discharged to the outside of the crucible.

In a device disclosed in Patent Document 2, a gas flow straightening cylinder is disposed above a silicon melt accommodated in a crucible. A heat insulating ring is attached to a lower end of the gas straightening cylinder.

For growing a monocrystal, inert gas is introduced to flow downwardly in the gas flow straightening cylinder to be blown onto a surface of a material melt. Further, the inert gas flows along the surface of the material melt and further flows through a lower edge of the gas flow straightening cylinder to turn upwardly. Then, the inert gas flows through a space between the heat insulating ring and an inner wall of the crucible to be discharged into a furnace body. More specifically, the flow velocity of the inert gas flowing through the space between the heat insulating ring and the inner wall of the crucible is adjusted to be 6.5 cm/sec.

In a device disclosed in Patent Document 3, four purge-gas nozzles are disposed at 90 degrees intervals around the central axis of a crucible.

For growing a monocrystal silicon rod, high velocity gas is delivered through the purge-gas nozzles to maintain a predetermined ambiance on a silicon melt containing additives such as arsenic. In other words, gas curtains substantially shaped in a cylinder are provided around the central axis of the crucible. Specifically, a first gas curtain is provided to flow downwardly outside a periphery of an open top of the crucible at a velocity which creates a region of low pressure within a crystal growth chamber radially outwardly from the open top of the crucible, and a second gas curtain is provided radially inwardly of the periphery of the open top of the crucible at a radially inner side of the first gas curtain.

Patent Document 1: JP-A-2002-321997
Patent Document 2: JP-A-2002-97098
Patent Document: JP-A-10-182289

DISCLOSURE OF THE INVENTION

Problems to Be Solved by the Invention

The arrangements disclosed in Patent Documents 1 and 2 may be combined with the arrangement disclosed in Patent Document 3 in which resistivity of a monocrystal is controlled using the silicon melt prepared by adding the dopant.

However, in the silicon melt prepared by adding the volatile dopant, the volatile dopant added to the silicon melt and a silicon oxide may be evaporated from the surface of the silicon melt during a period from addition of the dopant to the silicon melt until a columnar crystal body of the monocrystal is grown (i.e., until the crystal body of the monocrystal enters into the flow straightening cylinder; hereinafter referred to as post-addition-pre-growth period).

With the arrangements disclosed in Patent Documents 1 and 2, the flow of the inert gas in the outside of the gas flow straightening cylinder is controlled. Accordingly, when the above-described volatile dopant and silicon oxide are evaporated, evaporated components in an amorphous state may be adhered to an inner side of the gas flow straightening cylinder.

Also, with the arrangement disclosed in Patent Document 3, because inert gas is not actively delivered into a pulling-up chamber into which the monocrystal enters, evaporated components of the above-described volatile dopant and silicon oxide in an amorphous state may be adhered to an inner side of the pulling-up chamber during the post-addition-pre-growth period.

Consequently, the amorphous components adhered to the flow straightening cylinder or pulling-up chamber may be dropped into the melt during growing a crystal, thereby lowering a degree of monocrystallization. Further, when the volatile dopant is adhered and solidified, it may be difficult to remove the adhered dopant.

In order to prevent the evaporation of the volatile dopant during the post-addition-pre-growth period as described above, high pressure is usually applied on a furnace.

However, when high pressure is applied, inert gas does not flow smoothly at the flow volume that is the same as the flow volume of the inert gas when a crystal is pulled up under a typical low pressure, whereby the vicinity of a surface of a dopant-added melt in the flow straightening cylinder may be subjected to a high temperature. Thus, the evaporated components in an amorphous state may flow reversely together with the inert gas and be adhered to the flow straightening cylinder. The amorphous components adhered to the flow straightening cylinder may be dropped into the melt while growing a crystal, thereby lowering a degree of monocrystallization. Further, when the volatile dopant is solidified and adhered, it may be difficult to remove the adhered dopant.

An object of the invention is to provide a method of manufacturing a monocrystal, a flow straightening cylinder, and a monocrystal pulling-up device to prevent amorphous components from being adhered to the flow straightening cylinder, the amorphous components being generated from a dopant-added melt prepared by adding a volatile dopant into a silicon melt.

Means for Solving the Problems

A method of manufacturing a monocrystal according to an aspect of the invention includes: providing a monocrystal pulling-up device comprising a chamber, an intake provided on an upper portion of the chamber for introducing inert gas into the chamber, a crucible disposed within the chamber for accommodating a dopant-added melt prepared by adding a volatile dopant to a silicon melt, a flow straightening cylinder extending from the intake of the chamber to the vicinity of a surface of the dopant-added melt for guiding the inert gas to the dopant-added melt, and a pulling-up portion for pulling up a seed crystal after the seed crystal is brought into contact with the dopant-added melt so as to pass through the flow straightening cylinder; and controlling a pressure in the flow straightening cylinder to be in a range of 33331 Pa (250 Torr) to 79993 Pa (600 Torr) and a flow volume of the inert gas in the flow straightening cylinder to be in a range of 150 SL/min to 300 SL/min (flow velocity: in a range of 0.06 m/sec to 0.31 m/sec (0.005 to 0.056 SL/min·cm$^2$)) during a period from addition of the volatile dopant to the silicon melt accommodated in the crucible until a crystal body of the monocrystal enters into the flow straightening cylinder by being pulled up using the pulling-up portion (hereinafter referred to as post-addition-pre-growth period).

The flow velocity of gas according to the aspect of the invention is calculated by dividing a flow velocity of inert gas measured by a mass flow meter by the smallest cross-section area in the flow straightening cylinder (0.005 to 0.056 SL/min·cm$^2$ with 1 atmosphere pressure at 20 degrees C.). However, an actual temperature within a furnace is over 1000 degrees C. Accordingly, the temperature within the inert gas is also considerably increased, and an actual average flow velocity of inert gas particles in a longitudinal direction of the flow straightening cylinder is presumably over dozens of times as fast as the above-described flow velocity.

In the method of manufacturing a monocrystal using the monocrystal pulling-up device according to the aspect of the invention, during a period from the addition of the dopant to the silicon melt accommodated in the crucible until the crystal body of the monocrystal enters into the flow straightening cylinder by being pulled up, the pressure in the flow straightening cylinder is adjusted to be in the range of 33331 Pa (250 Torr) to 79993 Pa (600 Torr) and the flow velocity of the inert gas at a position of the flow straightening cylinder having the smaller diameter is adjusted to be in the range of 0.06 m/sec to 0.31 m/sec (0.005 to 0.056 SL/min·cm$^2$). The above-described period is a post-addition-pre-growth period until the columnar crystal body, which is formed after having a predetermined diameter by necking at an initial stage for growing a crystal and enlarging a shoulder portion to form a tapered portion having a diameter gradually expanding, enters into the flow straightening cylinder Here, it is found that, when the pressure in the flow straightening cylinder (hereinafter referred to as cylinder pressure) is set to be in a range of 33331 Pa to 79993 Pa, the evaporation of the volatile dopant in the dopant-added melt can be properly hampered.

In addition, it is found that, in a case where the flow velocity of the inert gas is adjusted to be in a range of 0.06 m/sec to 0.31 m/sec, even when the cylinder pressure is adjusted to be relatively high, e.g., in the range of 33331 Pa to 79993 Pa, the inert gas flows smoothly and an amount of amorphous components adhered to the flow straightening cylinder is restrained. Further, it is found that, when the flow velocity of the inert gas is adjusted to be over 0.31 m/sec, consumption of the inert gas is increased, so that cost reduction is not easily achieved and evaporation of the volatile dopant in the dopant-added silicon melt is accelerated. Furthermore, it is found, when the flow velocity of the inert gas is adjusted to be less than 0.06 m/sec, the inert gas does not flow smoothly and starts to flow upwardly. The flow velocity of gas is represented by formula 1. The cross-sectional area is an area at a position of the flow straightening cylinder having the smallest diameter. The flow velocity can be also changed by changing the cross-sectional area without changing a flow volume of inert gas.

$$\text{flow velocity} = \left( \frac{\text{flow volume}(SL/\min) \times 10^{-3}}{60} \right) \times \left( \frac{101325\,(\text{Pa})}{\text{pressure}(\text{Pa})} \right) \div \text{cross-sectional area (m}^2) \quad \text{(formula 1)}$$

By controlling the flow velocity of the inert gas during the post-addition-pre-growth period to be in the range of 0.06 m/sec to 0.31 m/sec, even when the cylinder pressure is adjusted to be relatively high, e.g., in the range of 33331 Pa to 79993 Pa, the inert gas can flow smoothly and elevation of amorphous components because of the reverse flow of the inert gas can be restrained. Thus, the amorphous components can be prevented from adhering to the flow straightening cylinder and from dropping off or sticking on the melt while growing a crystal, which prevents decrease in a degree of monocrystallization. In addition, the foulings can be easily removed.

A flow straightening cylinder provided in a monocrystal pulling-up device according to another aspect of the invention includes: a chamber; an intake provided on an upper portion of the chamber for introducing an inert gas into the chamber; and a crucible disposed within the chamber for accommodating a dopant-added melt prepared by adding a volatile dopant to a silicon melt, the flow straightening cylinder being shaped in a cylinder extending from the intake of the chamber to the vicinity of a surface of the dopant-added melt for guiding the inert gas to the dopant-added melt while allowing the monocrystal to be pulled up to pass through the cylinder, the flow straightening cylinder comprising: a first cylinder provided near the intake substantially shaped in a cylinder of which a largest inner diameter is a first diameter; and a second cylinder connected to an end of the first cylinder near the surface of the dopant-added melt and substantially shaped in a cylinder of which a largest inner diameter is a second diameter smaller than the first diameter. The second diameter is twice or three times as long as a diameter of a monocrystal, and a lower end of the second cylinder is connected to a lower end of an inverse conical heat-shielding plate.

In this arrangement, the flow straightening cylinder provided in the monocrystal pulling-up device includes: the first cylinder provided near the intake and substantially shaped in a cylinder of which the largest inner diameter is the first diameter; and the second cylinder connected to the end of the first cylinder near the dopant-added melt and substantially shaped in a cylinder of which the largest inner diameter is the second diameter smaller than the first diameter, the second portion having the second diameter over a section of the above length.

Accordingly, the flow velocity of the inert gas passing through the second cylinder can be increased relative to the flow velocity passing through the first cylinder. In addition, the inert gas can flow at a constant velocity for a predetermined time. In other words, even when the inert gas is introduced at a slow flow velocity as is conventional under the condition that the cylinder pressure is set to be in the range of 33331 Pa to 79993 Pa during the post-addition-pre-growth period, the flow velocity of the inert gas can be increased to be in the range of 0.06 m/sec to 0.31 m/sec (0.005 to 0.056 SL/min·cm²), which is higher than the conventional flow velocity. Thus, the volatile dopant and silicon oxide can be prevented from adhering to the flow straightening cylinder in an amorphous state and from dropping off or sticking on the melt, which prevents to lower a degree of monocrystallization. In addition, the foulings can be easily removed.

Further, even when the flow velocity of the inert gas in the chamber disposed above the flow straightening cylinder is set to be less than 0.06 m/sec, the flow velocity can be increased to be in the range of 0.06 m/sec to 0.31 m/sec (0.005 to 0.056 SL/min·cm²) in the flow straightening cylinder, thereby minimizing the flow volume of the inert gas introduced from the intake. Thus, consumption of the inert gas can be minimized, which easily allows cost reduction.

In the flow straightening cylinder according to the another aspect of the invention, it is preferable that the first cylinder is substantially shaped in a truncated cone cylinder of which an inner diameter on an end near the intake is the first diameter and of which an inner diameter on an end near the second cylinder is the second diameter, and the second cylinder is substantially shaped in a cylinder of which an inner diameter on an end near the first cylinder is the second diameter.

According to this arrangement, the first cylinder is substantially shaped in a truncated cone cylinder of which the inner diameter on the end near the intake is the first diameter and of which the inner diameter on the end near the second cylinder is the second diameter. The second cylinder is substantially shaped in a cylinder of which the inner diameter is the second diameter.

Since the inner diameter of a portion connecting the first cylinder and the second cylinder is the second diameter, the inert gas introduced into the first cylinder can be delivered into the second cylinder while minimizing inhibition of the flow. Thus, the flow velocity of the inert gas can be efficiently increased.

The flow straightening cylinder according to the another aspect of the invention, it is preferable that a first cylindrical member of which an inner diameter is the first diameter, the first cylindrical member being shaped in a cylinder extending from the intake of the chamber to the vicinity of the surface of the dopant-added melt; and a second cylindrical member mounted in an inner space of the first cylindrical member, in which the second cylindrical member has the second cylinder at an intermediate portion and has the first cylinder at an end.

According to this arrangement, the flow straightening cylinder includes: the first cylindrical member shaped in a cylinder of which the inner diameter is the first diameter, the cylinder extending from the intake of the chamber to the vicinity of the surface of the dopant-added melt; and the second cylindrical member mounted in the inner space of the first cylindrical member. The second cylindrical member has the second cylinder at the middle portion and the first cylinder at the end.

Accordingly, the flow straightening cylinder including the first cylinder and the second cylinder can be formed simply by mounting the second cylindrical member in the first cylindrical member, which easily leads to mass-production and cost-reduction. Also, since the flow straightening cylinder is traditionally provided only by the first cylindrical member, the flow straightening cylinder including the first cylinder and the second cylinder can be formed simply by mounting the second cylindrical member in the traditional flow straightening cylinder. Thus, the traditional flow straightening cylinder can be efficiently modified to hamper lowering of a degree of monocrystlization and to easily remove the foulings.

When a diameter of a crystal body of the monocrystal is represented by Rc, the second diameter is represented by R2, and a length of a portion having the second diameter is represented by R3, R2 preferably satisfies: 1.15<R2/Rc<1.25 and R3 preferably satisfies: 2<R3/Rc<3.

According to the arrangement, the flow straightening cylinder has the shape to satisfy the above formulae.

When the R2 satisfies 1.15>R2/Rc, the monocrystal may contact to an inner surface of the second cylinder while pulling up the monocrystal. On the other hand, when the R2 satisfies R2/Rc>1.25, i.e., when a space between the monocrystal and the second cylinder is increased, it may be difficult to increase the flow velocity of the inert gas.

Also, when the R3 is shortened, the gas flow may become turbulent on a lower side, thereby hampering monocrystallization.

Thus, the flow straightening cylinder has the shape to satisfy the above formulae, whereby a monocrystal can be prevented from being brought into contact with the flow straightening cylinder and a degree of monocrystallization can be prevented. In addition, the foulings can be easily removed.

A monocrystal pulling-up device according to still another aspect of the invention, includes: a chamber; an intake provided on an upper portion of the chamber for introducing an inert gas into the chamber; a crucible disposed within the chamber for accommodating a dopant-added melt prepared by adding a volatile dopant to a silicon melt; the flow straightening cylinder as described above that is shaped in a cylinder extending from the intake of the chamber to a vicinity of a surface of the dopant-added melt for guiding the inert gas to the dopant-added melt while allowing a monocrystal to be pulled up to pass through the cylinder; an inverse conical heat-shielding plate connected to a lower end of the flow straightening cylinder; and a pulling-up portion for pulling up a seed crystal after the seed crystal is brought into contact with the dopant-added melt so as to allow the seed crystal to pass through the flow straightening cylinder.

In this arrangement, the monocrystal pulling-up device is provided with the above-described flow straightening cylinder of the invention.

Thus, the monocrystal pulling-up device capable of properly manufacturing a monocrystal can be provided while attaining the same advantages as the above-described flow straightening cylinder.

BEST MODE FOR CARRYING OUT THE INVENTION

First Exemplary Embodiment

A first exemplary embodiment of the invention will be described with reference to the attached drawings.

Figure 1:
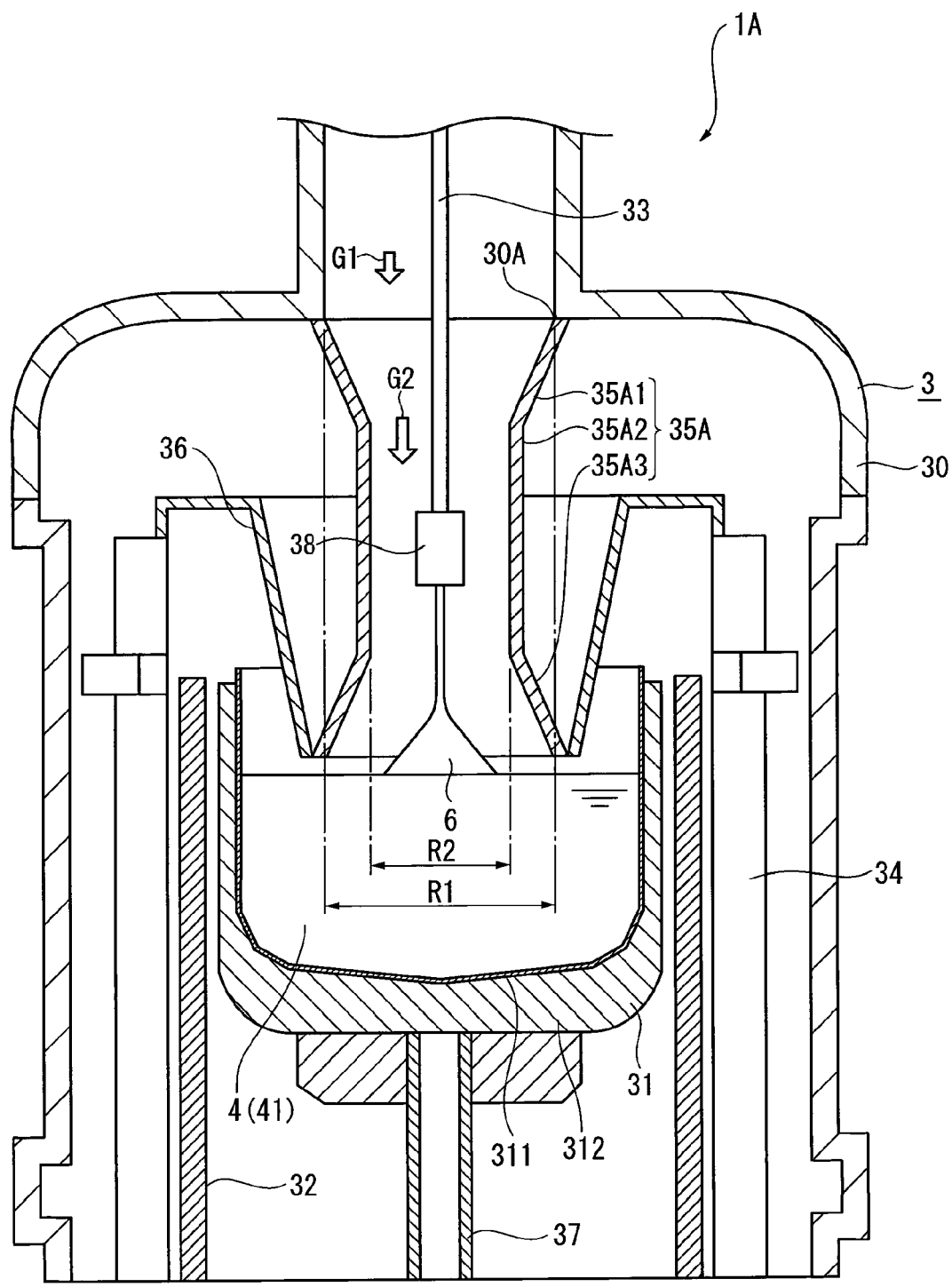
FIG. 1 schematically shows an arrangement of a monocrystal pulling-up device according to a first exemplary embodiment of the invention.

FIG. 1 schematically shows a monocrystal pulling-up device for use in manufacturing a monocrystal according to the first exemplary embodiment.

[Arrangement of Monocrystal Pulling-Up Device]

First of all, an arrangement of a monocrystal pulling-up device will be described.

As shown in FIG. 1, a monocrystal pulling-up device 1A includes a monocrystal pulling-up device body 3, a doping device (not shown), and a controller (not shown).

The monocrystal pulling-up device body 3 includes a chamber 30, a crucible 31 disposed within the chamber 30, a heater 32 for heating the crucible 31 by radiating heat to the crucible 31, a pulling-up cable (or rod) 33 (pulling-up portion), a heat insulating cylinder 34, a flow straightening cylinder 35A, and a shield 36.

Under control of the controller, a predetermined flow volume of inert gas, e.g., argon gas, is introduced into the chamber 30 downwardly from an upper side via an intake 30A provided at a boundary portion between an upper portion of the chamber 30 and a pulling-up chamber connected to the upper portion of the chamber 30. Pressure in the chamber 30 (i.e., furnace pressure) is controllable by the controller.

The crucible 31 is used for melting polycrystal silicon to yield a silicon melt 4. The crucible 31 includes: a first crucible 311 made of quartz and shaped in a cylinder having a bottom; and a second crucible 312 made of graphite and disposed at the outside of the first crucible 311 to house the first crucible 311. The crucible 31 is supported by a support shaft 37 that rotates at a predetermined speed.

The heater 32 is disposed at the outside of the crucible 31 and heats the crucible 31 to melt the silicon in the crucible 31.

The pulling-up cable (or rod) 33 is connected at its first end to, for instance, a pulling-up driver (not shown) disposed above the crucible 31. On the other hand, the pulling-up cable 33 is attached at its second end to a seed holder 38 for holding a seed crystal or to the doping device (not shown) as needed. The pulling-up cable 33 is rotatable by the driving of the pulling-up driver. By controlling the pulling-up driver with the controller, the pulling-up cable 33 is elevated at a predetermined pulling-up speed.

The heat insulating cylinder 34 is disposed to surround the crucible 31 and the heater 32.

The flow straightening cylinder 35A is for regulating flow of inert gas introduced from the upper side of the chamber 30. The flow straightening cylinder 35A is provided so as to surround a monocrystal 6 pulled by the pulling-up cable 33 from the intake 30A of the chamber 30 to the vicinity of a surface of the semiconductor melt 4. The flow straightening cylinder 35A includes a first cylinder 35A1 connected to the intake 30A, a second cylinder 35A2 connected to a lower end of the first cylinder 35A1, and a third cylinder 35A3 connected to a lower end of the second cylinder.

The first cylinder 35A1 is shaped in a truncated cone cylinder having an inner diameter R1 (first diameter) at an upper end and having an inner diameter R2 (second diameter) smaller than R1 at a lower end.

The second cylinder 35A2 is shaped in a cylinder having the inner diameter R2 and having a length R3.

The third cylinder 35A3 is shaped in a truncated cone cylinder having the inner diameter R2 at an upper end and having the inner diameter R1 at a lower end.

When a diameter of a columnar crystal body of the monocrystal 6 is Rc, the inner diameter R2 of the second cylinder 35A2 is set to satisfy the relational expression: $1.15<R2/Rc<1.25$. The length R3 of the second cylinder 35A2 is set so as to satisfy the relational expression: $2<R3/Rc<3$. The first and third cylinders 35A1 and 35A3 have the same shape.

The shield 36 is a heat shield for shielding radiation heat radiated upward from the heater 32. The shield 36 surrounds a portion of the flow straightening cylinder 35A lower than the approximate center thereof in a vertical direction. The shield 36 is disposed such that the lower end of the third cylinder 35A3 and a lower end the shield 36 are connected so as to cover the surface of the silicon melt 4. The shield 36 is shaped in a cone that has a lower opening smaller than an upper opening.

The doping device is used for volatilizing a solid volatile dopant and dope (i.e., add) the dopant to the semiconductor melt 4 in the crucible 31. Examples of the volatile dopant include red phosphorus and arsenic. The doping device may add the volatile dopant to the semiconductor melt 4 by soaking a lower end of a cylindrical portion in the semiconductor melt 4 or by blowing the volatilized volatile dopant into the semiconductor melt 4 while spacing the lower end of the cylindrical portion apart from the semiconductor melt 4.

The controller controls the gas flow volume, the furnace pressure and the pulling-up speed of the pulling-up cable 33 within the chamber 30 at a proper level based on setting inputted by an operator, thereby performing a control during the manufacturing of a monocrystal 6.

[Manufacturing Method of Monocrystal]

Next, a method of manufacturing a monocrystal 6 by use of the monocrystal pulling-up device 1A will be described.

First of all, an operator mounts the doping device onto the pulling-up cable 33 of the monocrystal pulling-up device 1A.

Then, under control of the controller, the monocrystal pulling-up device 1A sets the gas flow volume and the furnace pressure within the chamber 30 respectively into predetermined states, and adds the volatile dopant to the silicon melt 4 to prepare a dopant-added melt 41.

Subsequently, an operator detaches the doping device from the pulling-up cable 33 and then attaches the seed holder 38 holding a seed crystal onto the pulling-up cable 33.

Based on the setting inputted by an operator, the controller of the monocrystal pulling-up device 1A pulls up the seed crystal at a predetermined pulling-up speed to produce the monocrystal 6.

Here, during post-addition-pre-growth period, i.e., during a period from preparation of the dopand-added melt 41 until a crystal body of the monocrystal 6 enters into the flow straightening cylinder 35A by being pulled up, a cylinder pressure in the flow straightening cylinder 35A is adjusted to be in a range of 33331 Pa to 79993 Pa. At this time, a flow velocity G1 of inert gas is adjusted to be less than 0.06 m/sec as is conventional.

The inert gas speeds up and flows at a flow velocity G2 when flowing from the first cylinder 35A1 to the second cylinder 35A2 in the flow straightening cylinder 35A. The flow velocity G2 is adjusted to be in a range of 0.06 m/sec to 0.31 m/sec (0.005 to 0.056 SL/min·cm$^2$). Incidentally, in FIG. 1, the lengths of arrows showing the flow velocities G1 and G2 are proportional to the flow velocities.

After elapse of the post-addition-pre-growth period, the furnace pressure, inert gas and the like are controlled to be in predetermined states.

Advantage(s) of First Exemplary Embodiment(s)

As described above, the following advantages can be attained according to the first exemplary embodiment.

(1) When the monocrystal 6 is manufactured by pulling up the seed crystal using the monocrystal pulling-up device 1A after dipping the seed crystal in the dopant-added melt 41, the inert gas (argon gas) is controlled to be in the range of 150 SL/min to 300 SL/min such that the cylinder pressure in the flow straightening cylinder 35A is in the range of 33331 Pa to 79993 Pa and the flow velocity of the inert gas in the flow straightening cylinder 35A is in the range of 0.06 m/sec to 0.31 m/sec (0.005 to 0.056 SL/min·cm$^2$) during the post-addition-pre-growth period.

By adjusting the flow velocity of the inert gas to be in the above-described range during the post-addition-pre-growth period, the inert gas can flow smoothly even when the cylinder pressure is set to be relatively high as described above, thus preventing elevation of amorphous components (i.e., silicon oxide and dopant oxide) generated by being evaporated from the dopant-added melt 41 due to the reverse flow of the inert gas. Thus, the volatile dopant and silicon oxide can be prevented from adhering to the flow straightening cylinder 35A in an amorphous state and from dropping into the melt or sticking on the melt while growing a crystal, which prevents decrease in a degree of monocrystallization. In addition, the foulings can be easily removed.

(2) The flow straightening cylinder 35A includes: the first cylinder 35A1 connected to the intake 30A and substantially shaped in a cylinder having the largest inner diameter R1, and the second cylinder 35A2 connected to the lower end of the first cylinder 35A1 and substantially shaped in a cylinder having the largest inner diameter R2 smaller than R1 and having the length R3.

Accordingly, the flow velocity G2 of the inert gas while passing through the second cylinder 35A2 can be increased as compared with the flow velocity while passing through the first cylinder 35A1. In other words, during the post-addition-pre-growth period, even when the inert gas is introduced at the flow velocity G1 which is slow as is conventional, the inert gas can speed up to 0.06 m/sec to 0.31 m/sec (0.005 to 0.056 SL/min·cm$^2$). Thus, even when the flow velocity G1 of the introduced inert gas is less than 0.06 m/sec, the flow velocity can be accelerated to be in a range of 0.06 m/sec to 0.31 m/sec (0.005 to 0.056 SL/min·cm$^2$) in the flow straightening cylinder 35A, thereby minimizing the flow volume of the inert gas introduced from the intake 30A. Consequently, consumption of the inert gas can be minimized, which easily allows cost reduction.

(3) The first cylinder 35A1 of the flow straightening cylinder 35A is substantially shaped in a truncated cone cylinder having the inner diameter R1 at the upper end and having the inner diameter R2 at the lower end. Further, the second cylinder 35A2 is shaped in a cylinder having the inner diameter R2 at the upper end.

Since the inner diameter of a portion connecting the first cylinder 35A1 and the second cylinder 35A2 is set to be R2, the inert gas introduced into the first cylinder 35A1 can be delivered into the second cylinder 35A2 while minimizing inhibition of the flow of the inert gas. Thus, the inert gas can be efficiently accelerated.

(4) When the diameter of the crystal body of the monocrystal 6 is Rc, the flow straightening cylinder 35A has a shape so as to satisfy the relational formulae: $1.15 < R2/Rc < 1.25$ and $2 < R3/Rc < 3$.

Thus, while the monocrystal 6 can be prevented from being brought into contact with the flow straightening cylinder 35A, a degree of monocrystallization can be prevented from being lowered. In addition, the foulings can be easily removed.

(5) The first and third cylinders 35A1 and 35A3 have the same shape.

Accordingly, even when the flow straightening cylinder 35A is mounted such that the third cylinder 35A3 is disposed on an upper side unlike the above-described first exemplary embodiment, the same advantages can be attained as the advantages attained when the flow straightening cylinder 35A is mounted such that the first cylinder 35A1 is disposed on the upper side. Thus, the monocrystal pulling-up device 1A can be assembled without considering a mounting state of the flow straightening cylinder 35A, which improves operating efficiency.

Second Exemplary Embodiment

A second exemplary embodiment of the invention will be described with reference to the attached drawings.

Figure 3:
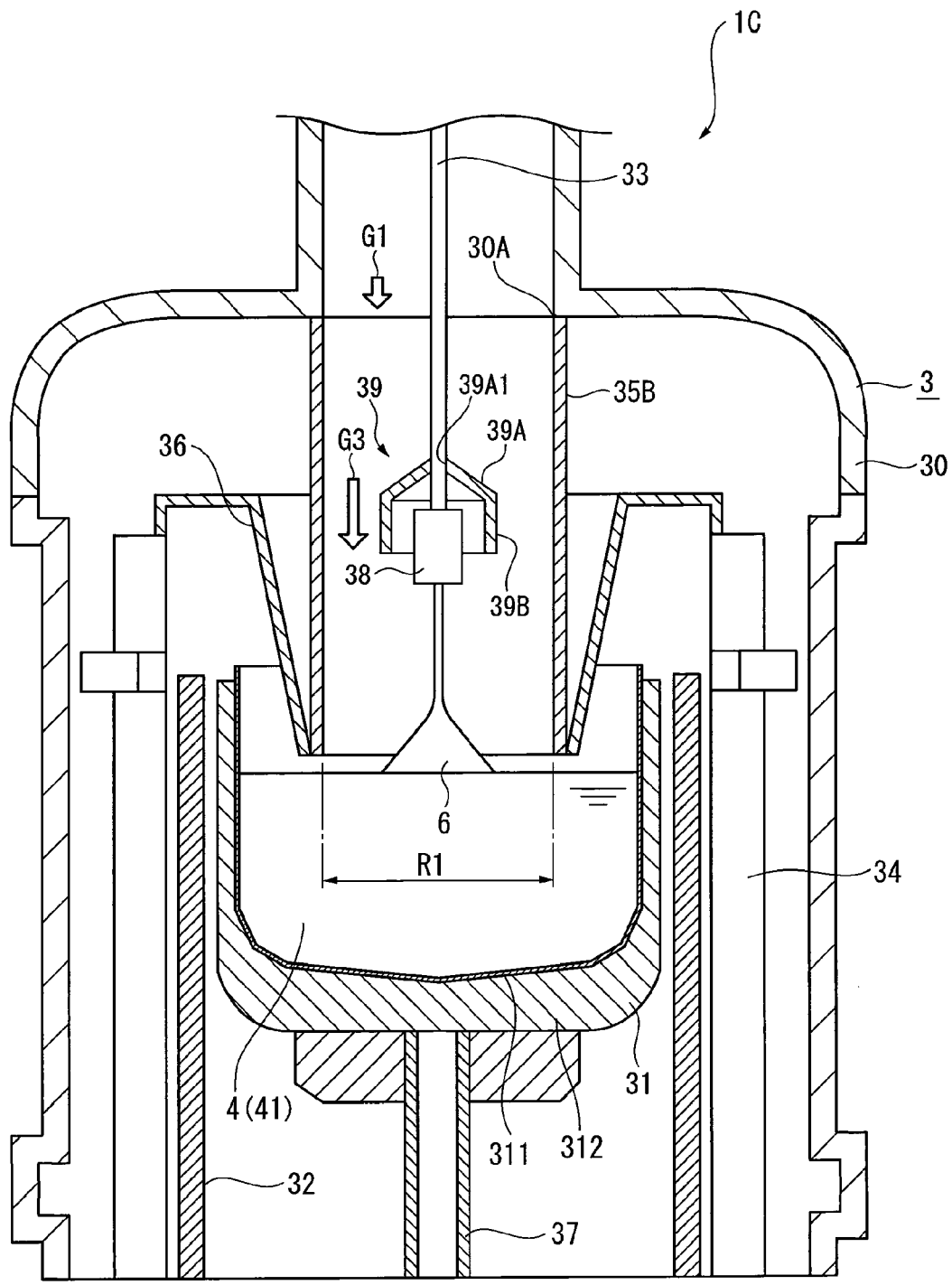
FIG. 3 schematically shows an arrangement of a monocrystal pulling-up device according to a second exemplary embodiment of the invention.

FIG. 3 schematically shows a monocrystal pulling-up device for use in manufacturing a monocrystal according to the second exemplary embodiment.

[Arrangement of Monocrystal Pulling-Up Device]

First of all, an arrangement of the monocrystal pulling-up device will be described.

In the following description, the same reference numerals will be attached to the components which are the same as the components of the monocrystal pulling-up devices 1A and 1B as described above, and the detailed description thereof will be simplified or omitted.

A monocrystal pulling-up device body 3 of a monocrystal pulling-up device 1C includes a chamber 30, a crucible 31, a heater 32, a pulling-up cable 33, a heat insulating cylinder 34, a flow straightening cylinder 35B, a shield 36, and a gas flow adjuster 39.

The gas flow adjuster 39, which covers a seed holder 38 (i.e., an upper portion of a seed crystal) and has a shape so as to provide a space between the flow straightening cylinder 35B and the gas flow adjuster 39, is mounted to the pulling-up cable 33. The gas flow adjuster 39 is disposed within the flow straightening cylinder 35B during the post-addition-pre-growth period. Also, the gas flow adjuster 39 includes a conical cylindrical section 39A as an oblique portion, and a cylindrical section 39B integrated with a portion corresponding to a bottom surface of the conical cylindrical section 39A.

An insertion hole 39A1, through which the pulling-up cable 33 is inserted, is provided on a top of the conical cylindrical section 39A. The cylindrical section 39B is provided so that the axis thereof coincides with the axis of the conical cylindrical section 39A.

By inserting the pulling-up cable 33 through the insertion hole 39A1, the gas flow adjuster 39 is mounted onto the pulling-up cable 33 while covering the upper portion of a seed crystal and providing the space between the flow straightening cylinder 35B and the gas flow adjuster 39. The gas flow adjuster 39 is mounted so that an outer circumference of the conical cylindrical section 39A is sloped downwardly from the vicinity of the axis of the flow straightening cylinder 35B toward the vicinity of the inner circumference thereof.

[Manufacturing Method of Monocrystal]

Next, a method of manufacturing a monocrystal 6 by use of the monocrystal pulling-up device 1C will be described. Hereinafter, the same operation as the first exemplary embodiment will be omitted.

A controller of the monocrystal pulling-up device 1C pulls up a seed crystal at a predetermined pulling-up speed after preparing a dopant-added melt 41 based on setting inputted by an operator to produce the monocrystal 6.

At this time, the cylinder pressure in the flow straightening cylinder 35B is adjusted to be in a range of 33331 Pa to 79993 Pa. Also, a flow velocity G1 of inert gas is adjusted to be less than 0.06 m/sec as is conventional.

The inert gas speeds up to flow at a flow velocity G3 when flowing through the space between the flow straightening cylinder 35B and the gas flow adjuster 39. The flow velocity G3 is adjusted to be in a range of 0.06 m/sec to 0.31 m/sec (0.005 to 0.056 SL/min·cm$^2$).

After elapse of the post-addition-pre-growth period, the furnace pressure, inert gas and the like are controlled to be in predetermined states.

Advantage(s) of Second Exemplary Embodiment

According to the above-described second embodiment, the following advantages can be attained in addition to the advantage (1) in the first exemplary embodiment.

(6) The gas flow adjuster 39 provided in the monocrystal pulling-up device 1C is disposed within the flow straightening cylinder 35B during the post-addition-pre-growth period. The gas flow adjuster 39 covers the upper portion of the seed crystal and has a shape so as to provide the space between the flow straightening cylinder 35B and the gas flow adjuster 39.

Accordingly, a flow path of the inert gas during the post-addition-pre-growth period can be narrowed down by the gas flow adjuster 39 as compared with a flow path when the gas flow adjuster 39 is not provided. Therefore, the flow velocity G3 of the inert gas during the post-addition-pre-growth period can be increased as compared with a flow velocity when the gas flow adjuster 39 is not provided. In other words, even when the inert gas is introduced at the flow velocity G1 that is slow as is conventional while the cylinder pressure is set to be in the range of 33331 Pa to 79993 Pa during the post-addition-pre-growth period, the flow velocity of the inert gas can be increased to be in the range of 0.06 m/sec to 0.31 m/sec which is higher than the conventional flow velocity. Thus, even when the flow velocity G1 of the introduced inert gas is less than 0.06 m/sec, the flow velocity can be increased to be in the range of 0.06 m/sec to 0.31 m/sec within the flow straightening cylinder 35B, thereby minimizing the flow volume of the inert gas introduced from the intake 30A. Consequently, consumption of the inert gas can be minimized, which easily leads to cost reduction.

(7) The gas flow adjuster 39 is mounted to the pulling-up cable 33.

Since the gas flow adjuster 39 is mounted to the pulling-up cable 33 that is movable upwardly, a timing for controlling the flow velocity of the inert gas can be controlled by changing the mounting position of the gas flow adjuster 39 as needed. Thus, a producing state of the monocrystal 6 can be controlled more specifically, thereby producing the monocrystal 6 more appropriately.

(8) The gas flow adjuster 39 is mounted so that the outer circumference of the conical cylindrical section 39A is sloped downwardly from the vicinity of the axis of the flow straightening cylinder 35B toward the inner circumference thereof.

Thus, the inert gas arriving at an upper end of the gas flow adjuster 39 can be guided downwardly while inhibition of the flow is minimized. Consequently, the flow velocity of the inert gas can be efficiently increased.

Third Exemplary Embodiment

Now, a third exemplary embodiment of the invention will be described below.

Figure 2:
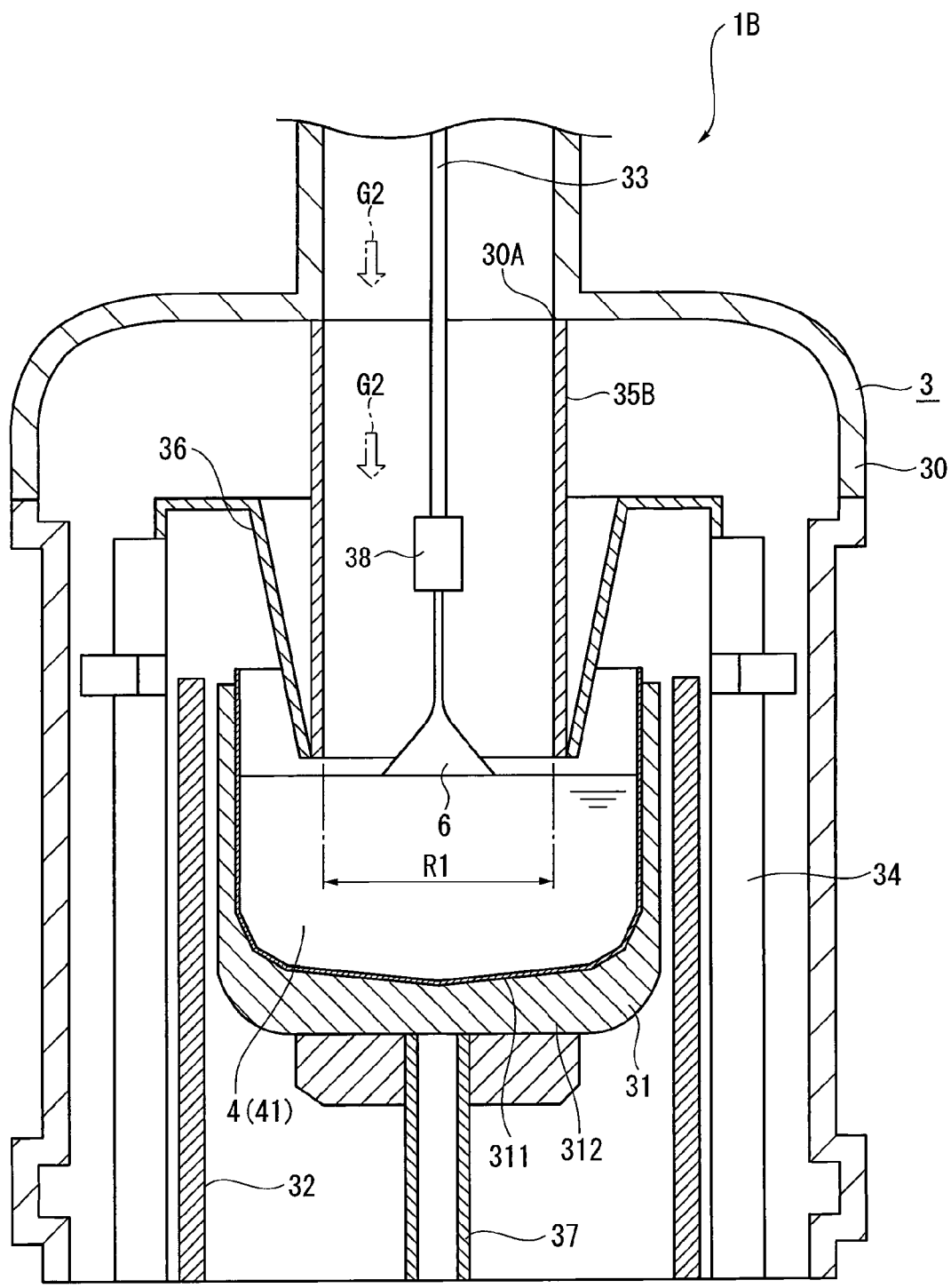
FIG. 2 schematically shows an arrangement of a monocrystal pulling-up device according to a comparison and a third exemplary embodiment of the invention.

In the third exemplary embodiment, a flow velocity of inert gas is controlled by the monocrystal pulling-up device 1B shown in FIG. 2 in a state different from a state for preparing a comparison sample as described above. An explanation of the arrangement of the monocrystal pulling-up device 1B will be omitted and only a method of manufacturing a monocrystal will be described.

[Manufacturing Method of Monocrystal]

The controller of the monocrystal pulling-up device 1B pulls up a seed crystal at a predetermined pulling-up speed after preparing a dopant-added melt 41 based on setting inputted by an operator to produce a monocrystal 6.

At this time, the cylinder pressure in the flow straightening cylinder 35B is adjusted to be in a range of 33331 Pa to 79993 Pa. The inert gas is introduced from the intake 30A at the flow velocity G2 of 0.06 m/sec to 0.31 m/sec (0.005 to 0.056 SL/min·cm$^2$) which is higher than the flow velocity when the comparison sample is manufactured.

After elapse of the post-addition-pre-growth period, the furnace pressure, inert gas and the like are controlled to be in predetermined states.

Advantage(s) of Third Exemplary Embodiment

According to the above-described third embodiment, the following advantages can be attained in addition to the advantage (1) in the first exemplary embodiment.

(9) For controlling the flow velocity of the inert gas in the flow straightening cylinder 35B during the post-addition-pre-growth period to be in the range of 0.06 m/sec to 0.31 m/sec (0.005 to 0.056 SL/min·cm$^2$), the inert gas having the flow velocity G2 of 0.06 m/sec to 0.31 m/sec is introduced from the intake 30A.

Although the consumption of the inert gas is increased as compared with that of the first and second exemplary embodiments, a simple arrangement can be employed in which the flow velocity of the introduced inert gas is higher than the conventional flow velocity without modifying the conventional monocrystal pulling-up device 1B. With this simple arrangement, amorphous components can be prevented from being adhered to the flow straightening cylinder 35B and from dropping into the melt or sticking on the melt while growing a crystal, which prevents decrease in a degree of monocrystallization. In addition, the foulings can be easily removed.

Other Exemplary Embodiments

It should be noted that the invention is not limited to the above embodiments, but various improvements and modifications may be made without departing from the spirit and scope of the invention.

Figure 4:
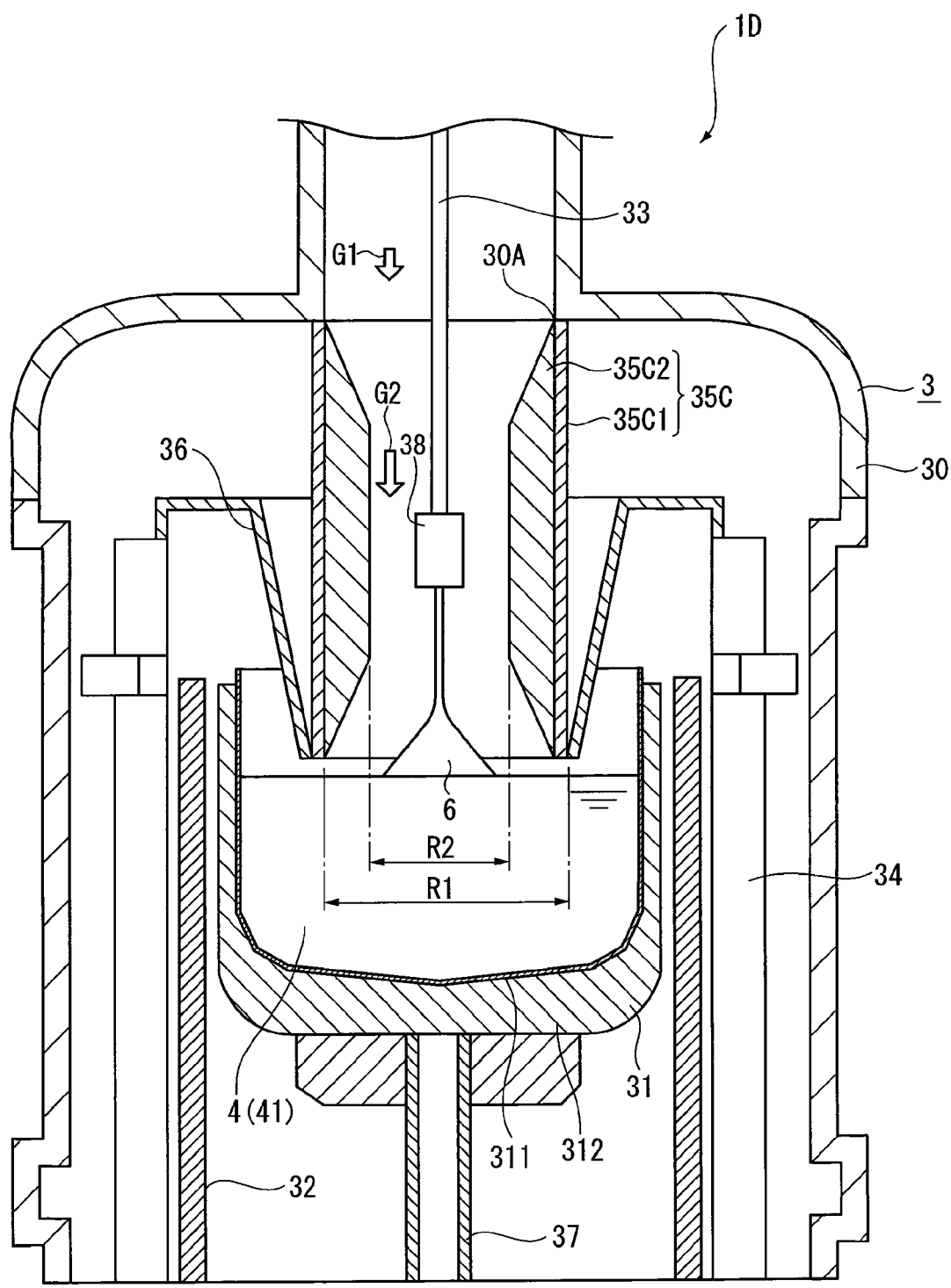
FIG. 4 schematically shows an arrangement of a monocrystal pulling-up device according to another exemplary embodiment of the invention.

A monocrystal pulling-up device 1D may be used as shown in FIG. 4. Specifically, the monocrystal pulling-up device 1D includes a flow straightening cylinder 35C in place of the flow straightening cylinder 35A provided in the monocrystal pulling-up device 1A. The flow straightening cylinder 35C includes a first cylindrical member 35C1 shaped in a cylinder having a constant inner diameter R1 and a second cylindrical member 35C2 mounted in an inner space of the first cylindrical member 35C1.

Like the first cylinder 35A2 of the flow straightening cylinder 35A, the second cylindrical member 35C2 has an inner surface substantially shaped in a cylinder having the inner diameter R2 (second diameter) at an intermediate portion. End portions of the second cylindrical member 35C2 have an inner surface shaped in a truncated cone. The inner diameter of the end portions is gradually enlarged from the second diameter R2 to the first diameter R1 as extending toward openings provided on both ends. The conical surface creates the same shape as that of the above-described first cylinder 35A1 as shown in FIG. 1. Accordingly, the inner circumference of the second cylindrical member 35C2 has the same shape as the inner circumference of the flow straightening cylinder 35 shown in FIG. 1.

With this arrangement, the flow velocity of the inert gas can be controlled in the same manner as in the first exemplary embodiment, so that the advantages (1), (4) and (5) in the first exemplary embodiment can be attained.

Further, the flow straightening cylinder 35C can be assembled simply by inserting the second cylindrical member 35C2 into the first cylindrical member 35C1, which easily leads to mass-production and cost-reduction. Furthermore, the flow straightening cylinder 35C can be assembled simply by inserting the second cylindrical member 35C2 into the typically used flow straightening cylinder 35B that has the same shape as the first cylindrical member 35C1. By using the flow straightening cylinder 35C, a degree of monocrystlization can be prevented from being lowered, and the foulings can be easily removed. Thus, the typically used flow straightening cylinder 35B can be effectively used.

In the first exemplary embodiment, the third cylinder 35A3 may not be provided within the flow straightening cylinder 35A.

Also, in the first exemplary embodiment, a cylindrical section having the inner diameter R1 may be connected to the upper end of the first cylinder 35A1 of the flow straightening cylinder 35A so that a portion including a truncated cone cylindrical section and a cylindrical section provides the first cylinder of the invention.

Further, when the diameter of the crystal body of the monocrystal 6 is Rc, the flow straightening cylinder 35A may not have a shape to satisfy the relational expression: 1.15<R2/Rc<1.25.

In the second exemplary embodiment, the gas flow adjuster 39 may not be mounted to the pulling-up cable 33. Alternatively, a member for lifting up and down the gas flow adjuster 39 may be independently provided.

Then, the gas flow adjuster 39 may be provided only by a cylindrical section having one end substantially closed. In other words, a portion sloped downwardly from the vicinity of the axis of the flow straightening cylinder 35B toward the vicinity of the inner circumference may not be provided. Alternatively, the gas flow adjuster 39 may not be provided with the cylindrical section 39B.

Incidentally, when a dopant that is not volatile is used as a dopant for doping the silicon melt 4, amorphous components may be adhered to the flow straightening cylinder by evaporation of silicon, not by evaporation of the dopant. By applying the invention, adhesion of the amorphous components due to evaporation of silicon can be restrained. However, manufacturing conditions are preferably adjusted as necessary in view of effect on quality of a monocrystal.

EXAMPLE(S)

Next, as an example of the first exemplary embodiment of the invention, a relationship among a flow velocity of inert gas in a flow straightening cylinder during post-addition-pre-growth period, an amount of amorphous components adhered to the flow straightening cylinder, and a degree of monocrystallization will be described.

[Experiment Method]

First of all, an arrangement of a monocrystal pulling-up device used for manufacturing monocrystals as a comparison sample and an example sample will be described.

For manufacturing the example sample, the monocrystal pulling-up device 1A of the first exemplary embodiment was used.

As shown in FIG. 2, the monocrystal pulling-up device 1B used for producing the comparison sample included the flow straightening cylinder 35B shaped in a cylinder having the inner diameter R1 in place of the flow straightening cylinder 35A provided in the monocrystal pulling-up device 1A. In other words, while the flow velocity of inert gas can be increased within the flow straightening cylinder 35A of the monocrystal pulling-up device 1A, the flow velocity cannot be increased within the flow straightening cylinder 35B of the monocrystal pulling-up device 1B. Incidentally, the flow straightening cylinders 35A and 35B were used when R1 and R2 were set to be 280 mm and 250 mm, respectively.

Monocrystals of the comparison sample and the example sample were manufactured using the monocrystal pulling-up devices 1A and 1B under a condition as shown in Table 1. An amount of amorphous components adhered to the flow straightening cylinders 35A and 35B and a degree of monocrystallization while manufacturing these monocrystals were checked. Table 1 shows Ar gas conditions in which the flow velocity within the flow straightening cylinder 35A during the post-addition-pre-growth period in manufacturing the example sample was in a range of 0.06 m/sec to 0.31 m/sec (0.005 to 0.056 SL/min·cm$^2$) and the flow velocity within the flow straightening cylinder 35B during post-addition-pre-growth period in manufacturing the comparison sample was less than 0.06 m/sec.

TABLE 1

| | |
|---|---|
| diameter of pulled-up monocrystal | 200 mmφ |
| dopant | As (arsenic) |
| cylinder pressure (pa) | 33331 to 79993 (250 to 600 torr) |
| flow volume (SL/min) | 150 to 300 |

[Experiment Result]

As shown in Table 2 as follows, it was found that the adhered amount of amorphous components while manufacturing the example sample was smaller than the adhered amount of amorphous components while manufacturing the comparison sample. In addition, it was found that the degree of monocrystallization in manufacturing the example sample was higher than the degree of monocrystallization in manufacturing the comparison sample.

These results were observed presumably because, by controlling the flow velocity of the inert gas to be in the range of 0.06 m/sec to 0.31 m/sec, even when the cylinder pressure was set to be relatively high, the inert gas flowed smoothly. Thus, a temperature difference in the vicinity of the surface of the dopant-added melt 41 and the vicinity of the intake 30A in the flow straightening cylinder 35A was minimized and elevation of the amorphous components generated by evaporation of volatile dopant or silicon oxide was restrained. When the flow velocity of the inert gas was less than 0.06 m/sec, the inert gas did not flow smoothly and started to flow reversely, so that a large amount of the amorphous components were adhered to the chamber 30 and components provided in the chamber 30, which were provided above the dopant-added melt 41. The adhered amorphous components were presumably dropped off while pulling up a monocrystal to be adhered to the monocrystal. Thus, a degree of crystallization was lowered.

From the above, it was found that, when a monocrystal was manufactured while the cylinder pressure was set to be relatively high, the adhered amount of the amorphous components were decreased by controlling the flow velocity of inert gas to be in the range of 0.06 m/sec to 0.31 m/sec, which prevented to lower the degree of monocrystallization and allowed easy removal of the foulings.

TABLE 2

|  | adhered amount of amorphous components | degree of crystallization |
|---|---|---|
| example sample | small | 90% |
| comparison sample | large | 60% |

The invention claimed is:

1. A method of manufacturing a monocrystal, comprising: providing a monocrystal pulling-up device comprising:
   (i) a chamber,
   (ii) an intake provided on an upper portion of the chamber for introducing an inert gas into the chamber,
   (iii) a crucible disposed within the chamber for accommodating a dopant-added melt prepared by adding a volatile dopant to a silicon melt,
   (iv) a flow straightening cylinder extending from the intake of the chamber to a vicinity of a surface of the dopant-added melt for guiding the inert gas to the dopant-added melt, the flow straightening cylinder comprising a first cylinder connected to the intake and having a maximum inner diameter of a first diameter and a second cylinder connected to an end of the first cylinder near the surface of the dopant-added melt and having a maximum inner diameter of a second diameter which is smaller than the first diameter, and
   (v) a pulling-up portion for pulling-up a seed crystal after the seed crystal is brought into contact with the dopant-added melt so as to pass through the flow straightening cylinder; and
   controlling a flow velocity of an inert gas in an upper portion of the chamber above the flow-straightening cylinder in a range of less than 0.06 m/sec (0.005 SL/min·cm$^2$), and controlling a pressure in the flow straightening cylinder to be in a range of 33331 Pa (250 Torr) to 79993 Pa (600 Torr) and a flow velocity of the inert gas in the flow straightening cylinder to be in a range of 0.06 m/sec to 0.31 m/sec (0.005 to 0.056 SL/min·cm$^2$) during a period from the addition of the volatile dopant to the silicon melt accommodated in the crucible until a crystal body of the monocrystal enters into the flow straightening cylinder by being pulled-up using the pulling-up portion.

2. A flow straightening cylinder provided in a monocrystal pulling-up device including:
   (i) a chamber;
   (ii) an intake provided on an upper portion of the chamber for introducing an inert gas into the chamber; and
   (iii) a crucible disposed within the chamber for accommodating a dopant-added melt, prepared by adding a volatile dopant to a silicon melt, wherein the flow straightening cylinder is shaped as a cylinder extending from the intake of the chamber to a vicinity of a surface of the dopant-added melt for guiding the inert gas to the dopant-added melt, while allowing the monocrystal to be pulled-up to pass through the cylinder, and wherein the flow straightening cylinder comprises:
   a first cylinder which is connected to the intake and which is substantially shaped as a cylinder whose largest inner diameter is a first diameter; and
   a second cylinder which is connected to an end of the first cylinder near the surface of the dopant-added melt and which is substantially shaped as a cylinder whose largest inner diameter is a second diameter smaller than the first diameter.

3. The flow straightening cylinder according to claim 2, wherein the first cylinder is substantially shaped as a truncated cone cylinder whose inner diameter at an end near the intake is the first diameter and whose inner diameter at an end near the second cylinder is the second diameter, and
   wherein the second cylinder is substantially shaped as a cylinder whose inner diameter at an end near the first cylinder is the second diameter.

4. The flow straightening cylinder according to claim 2, further comprising:
   a first cylindrical member whose inner diameter is the first diameter, wherein the first cylindrical member is shaped as a cylinder extending from the intake of the chamber to the vicinity of the surface of the dopant-added melt; and
   a second cylindrical member mounted in an inner space of the first cylindrical member, wherein the second cylindrical member has the second cylinder at an intermediate portion and has the first cylinder at an end portion.

5. The flow straightening cylinder according to claim 2, wherein, when a diameter of a crystal body of the monocrystal is represented by Rc, the second diameter is represented by R2, and a length of a portion having the second diameter is represented by R3, R2 satisfies: $1.15 < R2/Rc < 1.25$ and R3 satisfies: $2 < R3/Rc < 3$.

6. A monocrystal pulling-up device, comprising:
   a chamber;
   an intake provided on an upper portion of the chamber for introducing an inert gas into the chamber;
   a crucible disposed within the chamber for accommodating a dopant-added melt prepared by adding a volatile dopant to a silicon melt;
   the flow straightening cylinder according to claim 2 that is shaped as the cylinder extending from the intake of the chamber to the vicinity of the surface of the dopant-added melt for guiding the inert gas to the dopant-added melt, while allowing the monocrystal to be pulled-up to pass through the cylinder; and
   a pulling-up portion for pulling-up a seed crystal after the seed crystal is brought into contact with the dopant-added melt so as to allow the seed crystal to pass through the flow straightening cylinder.

* * * * *